United States Patent
Blalock

(10) Patent No.: US 6,674,158 B2
(45) Date of Patent: Jan. 6, 2004

(54) SEMICONDUCTOR DIE PACKAGE HAVING A UV CURED POLYMERIC DIE COATING

(75) Inventor: Guy Blalock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/086,907

(22) Filed: Feb. 28, 2002

(65) Prior Publication Data

US 2002/0098626 A1 Jul. 25, 2002

Related U.S. Application Data

(63) Continuation of application No. 09/146,107, filed on Sep. 3, 1998, now abandoned.

(51) Int. Cl.[7] .............................................. H01L 23/29
(52) U.S. Cl. ..................... 257/678; 257/702; 257/788; 257/790; 438/127
(58) Field of Search ................................ 438/126, 127; 257/687, 678, 701, 702, 788, 790

(56) References Cited

U.S. PATENT DOCUMENTS

| 4,741,926 | A | | 5/1988 | White et al. ................ 427/240 |
| 4,942,140 | A | * | 7/1990 | Ootsuki et al. |
| 5,589,714 | A | | 12/1996 | Howard ....................... 257/788 |
| 5,685,916 | A | | 11/1997 | Ye et al. ........................ 134/1.1 |
| 5,736,424 | A | | 4/1998 | Prybyla et al. ............. 437/228 |
| 6,025,262 | A | | 2/2000 | Tuttle et al. ................ 438/624 |
| 6,028,773 | A | | 2/2000 | Hundt ......................... 361/760 |
| 6,054,222 | A | | 4/2000 | Takami et al. .............. 428/417 |
| 6,129,955 | A | | 10/2000 | Papathomas et al. ....... 427/517 |
| 6,168,898 | B1 | | 1/2001 | Xu et al. ...................... 430/176 |
| 6,284,565 | B1 | * | 9/2001 | Tachibana et al. .......... 438/106 |
| 6,521,480 | B1 | * | 2/2003 | Mitchell et al. ............ 438/108 |
| 6,525,429 | B1 | * | 2/2003 | Kovac et al. ................ 257/778 |

OTHER PUBLICATIONS

Dow Plastics, "Epoxy Novolac Resins," Oct. 1998, pp. 1–25.
Sartomer. http://www.sartomer.com/.

* cited by examiner

*Primary Examiner*—Mary Wilczewski
(74) *Attorney, Agent, or Firm*—Ormiston & McKinney, PLLC

(57) ABSTRACT

A permanent protective semiconductor die coating made from a polymer that is fully curable through exposure to ultra violet light. A mixture of polymer resin and a photo-active compound is applied to the die and then cured through exposure to ultraviolet light to form the protective coating. In one preferred embodiment, the polymer resin is a phenol-formaldehyde epoxy resin and the photoactive compound is CD1011 (marketed under the brand name SARTOMER". The coating may be applied as a thin protective film, such as a passivation layer, or as a thicker encapsulant used for semiconductor device packages. Such film coatings exhibit reduced film shrinkage and lower film stresses while maintaining mechanical properties comparable to polyimide film coatings.

5 Claims, 1 Drawing Sheet

SEMICONDUCTOR DIE PACKAGE HAVING A UV CURED POLYMERIC DIE COATING

CROSS REFERENCE TO RELATED APPLICATIONS

This is a continuation of application Ser. No. 09/146,107 filed Sep. 3, 1998, now abandoned.

FIELD OF THE INVENTION

The invention relates to polymeric semiconductor die coatings cured with ultra violet light.

BACKGROUND OF THE INVENTION

Passivation films and other semiconductor die coatings are commonly used as a barrier to physical damage and environmental contaminants. In the manufacture of semiconductor devices, the entire top surface of the wafer is often coated with a passivation film following the formation of the final metal layer. The passivation film is an insulating protective layer that minimizes mechanical and chemical damage to the dies during assembly and packaging. The passivation film material should be impermeable to moisture and to sodium atoms and other highly mobile impurities. Inorganic compounds such as phosphosilicate glass and silicon nitride are often used to form passivation films. More recently, organic polymers have been used for passivation films.

Polyimide is presently the most common type of polymer used to form passivation films. The polyimide film is spun on to the wafer as a liquid polyamic-acid precursor. During high temperature curing, the polyamic acid undergoes a chemical change called imidization that causes it to become the solid polyimide film. Problems with polyimide die coatings center around the ability to properly cure the film. To cure the liquid precursor, high temperature cycles are used to drive the imidization reaction. For example, the wafer is heated to 100° C.–150° C. for 30 minutes to evaporate the solvent and then the wafer is baked at about 300° C. for 60 minutes to fully cure the film. It is not unusual for the polyimide to lose 20%–30% of its volume during the imidization/curing process. The substantial shrinkage of the polyimide film as well as other aspects of the imidization process cause severe stress on the wafer surface which, in extreme cases, leads to film pealing and/or reduction in yield as a result of surface cracks and dislocations induced in the substrate.

Polyimides are also being investigated for use as permanent resist films. Photosensitive polyimide precursors are spun on to the wafer and, upon exposure to ultra violet light, undergo cross linking. During development, the unexposed regions are dissolved and final curing by heat treatment leads to imidization of the remaining crosslinked material. At 275° C. nearly all of the precursor is converted to polyimide and most of the photo-crosslinked groups are volatized. The properties of the final cured film are essentially the same as those of the non-photosensitive polyimide. One example of the use of polyimides as a permanent photoresist is described in U.S. Pat. No. 5,013,689 issued to Yamamoto et al. on May 7, 1991. Yamamoto describes a method of forming a two layer passivation film wherein the resist film used to pattern the first passivation film is retained as the second part of the two part passivation film. In Yamamoto, a conventional positive acting resist, a light sensitive polyimide and a light sensitive silicone ladder polymer were each used to pattern a silicon nitride passivation film. The resist was left intact after the passivation film is patterned. It was then "post-baked" to render it suitable for use as the second part of the resulting two part passivation film.

SUMMARY OF THE INVENTION

The present invention is directed to a permanent protective semiconductor die coating made from a polymer that is fully curable through exposure to ultra violet light. A mixture of polymer resin and a photoactive compound is applied to the die and then cured through exposure to ultraviolet light to form the protective coating. In one preferred embodiment, the polymer resin is a phenol-formaldehyde epoxy resin and the photoactive compound is CD1011 (triaryl sulfonium hexafluorophosphate) marketed under the brand name SARTOMER. The coating may be applied as a thin protective film, such as a passivation layer, or as a thicker encapsulant used for semiconductor device packages. Such film coatings exhibit reduced film shrinkage and lower film stresses while maintaining mechanical properties comparable to polyimide film coatings.

DETAILED DESCRIPTION OF THE INVENTION

The manufacture of semiconductor devices involves building integrated circuits on silicon wafers. The silicon wafer is the base substrate upon which successive layers of insulating, conducting and semiconducting materials are stacked. These layers are patterned and usually linked to surrounding areas and other layers to form electronic elements or other structures that perform specific functions. One of the last layers formed on the wafer is a metal layer that is patterned into a series of metal wires. A passivation layer is formed over the surface of the wafer to cover this final metal wiring pattern. The passivation layer is an insulating and protective layer that prevents mechanical and chemical damage during assembly and packaging. The passivation layer is patterned to expose select areas on the metal wires. These areas, commonly referred to as bond pads, are the contact points through which the circuits on the semiconductor device are connected to external circuits and devices.

Figure 1:
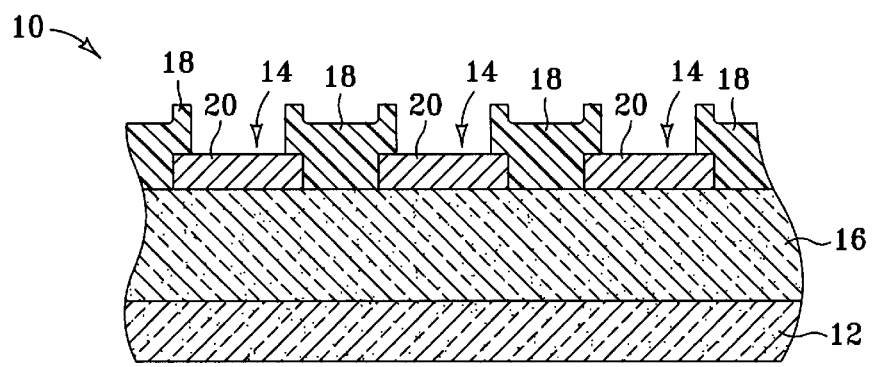
FIG. 1 is a partial cross section view of a semiconductor die having a passivation film coating made of a UV cured polymer.

Referring to FIG. 1, semiconductor device 10 represents generally an integrated circuit device such as a random access memory (RAM), a read only memory (ROM), or a logic circuit. The integrated circuits (not shown) are formed in a main region 12 of semiconductor device 10. The integrated circuits are electrically connected to wires formed on an insulating layer 16. Insulating layer 16, typically made of phosphosilicate glass, is formed over the integrated circuits and usually extends to cover the entire upper surface of the device. Insulating layer 16 is patterned to open contact vias (not shown) to the integrated circuits in the main region 12 of semiconductor device 10. A metal layer formed over insulating layer 16 is patterned to form the wires. Passivation layer 18 is then formed over the entire surface of the device. Passivation layer 18 is patterned to expose select areas of the wires. These exposed areas constitute bond pads 20.

Passivation layer 18 is made of a composite of silicon dioxide, silicon nitride and a polymer that is fully curable through exposure to ultra violet light. In one preferred embodiment of the invention, the photo sensitive polymer is spun on to the wafer in the form of a liquid. The liquid film is cured into a solid or semi-solid layer by irradiating the film with ultra violet light. The polymer includes a base resin mixed with a photoactive compound or "photoinitiator" as it is sometimes called. Suitable base resins include phenol-formaldehyde epoxy novolac resins such as Dow Chemical Company's D.E.N.® 431 epoxy novolac resin. Dow D.E.N.® 431 epoxy novolac resin shrinks only 5%–10% by volume upon curing. It is expected that other phenol-formaldehyde resins will exhibit similarly favorable shrink rates. Suitable photoactive compounds include CD1011 (triaryl sulfonium hexafluorophosphate) marketed under the brand name SARTOMER. Preferably, the film is irradiated with light having a wavelength in the range of 200–400 nm at a dose of 2–20 eV for 15–20 seconds. The actual cure conditions used in a specific application will vary within these preferred ranges according to the type of base resin and the type and amount photoactive compound are used to form the liquid film.

The coating composition may be prepared as a resinous liquid or as an organic solvent solution containing the resin, photoactive compound and any other components necessary or desirable for a particular application (e.g., fillers, catalysts, mold release agents, or pigments). Curing may be effected at room temperature. If the coating composition is applied as a solution, by spin coating on to a semiconductor wafer for example, then the wafer is heated first to evaporate the solvent. It is usually sufficient to remove the solvent by heating the wafer to 100° C.–150° C. for about 30 minutes. The amount of ultra violet light and the duration of exposure required to cure the coating depends primarily on the amount and type of radiation sensitive photoinitiator, the thickness of the coating and the degree of curing desired. Suitable doses of ultra violet light having a wavelength in the range of 200–400 nm include from about 2 eV to about 20 eV. A typical passivation film coating on the order of 10 microns thick will cure upon exposure to the ultra violet light for 15–20 seconds.

The following example illustrates one preferred formulation and application of the UV cured polymer semiconductor die coating.

EXAMPLE

Dow Chemical D.E.N.® 431 epoxy novolac resin, available from Dow Chemical Company in Midland, Mich., was mixed with the photoinitiator CD1011 (triaryl sulfonium hexafluorophosphate) marketed under the brand name SARTOMER" in a propylene glycol acitate solvent. The components were mixed at the rate of 55% by volume solvent, 44% by volume resin and 1% by volume photoinitiator. The mixture was procured in solution from Dow Chemical. The solution was spun on to a dummy wafer using conventional spin coating equipment. The wafer was heated to 100° C. for 30 minutes to evaporate the solvent and then the coating was irradiated with ultra violet light having a wavelength of 248 nm at a dose of 200 mJ.

Figure 2:
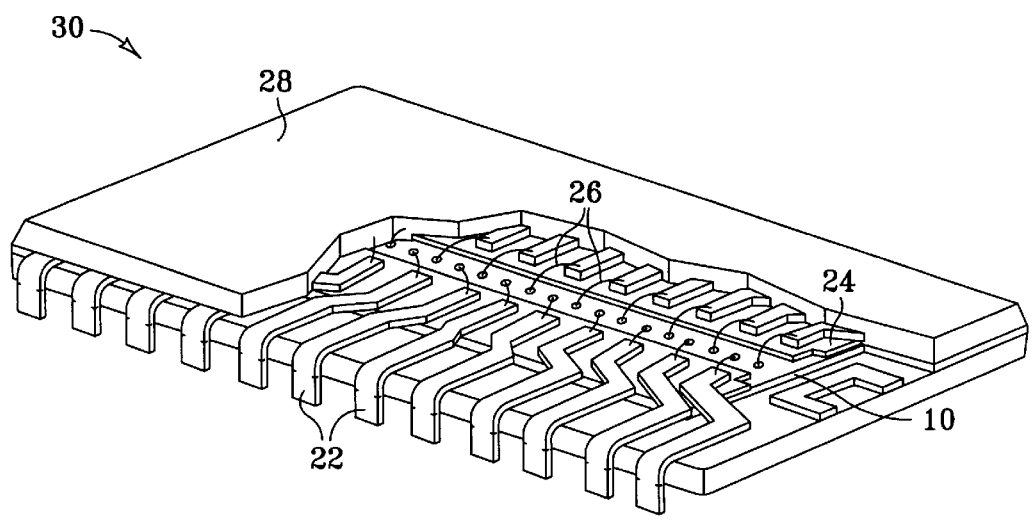
FIG. 2 is a cut away perspective view of a fully assembled and packaged semiconductor die wherein the encapsulating material is a UV cured polymer.

Another embodiment of the invention is illustrated in FIG. 2. In FIG. 2, a series of metal leads 22 are positioned over and attached to semiconductor device 10 by a layer of adhesive material 24. Bond wires 26 extend between and electrically connect leads 22 to bond pads 20. Semiconductor device 10 and the inner portion of leads 22 are imbedded within encapsulating material 28. Encapsulating material 28 is a UV curable polymer such as the phenol-formaldehyde epoxy novolac resins described above.

The die coatings and encapsulants may be formed by processing a polymer with a photointiator or cross linking agent to facilitate curing. Alternatively, it is expected that internally cross linked copolymers that do not require a photointiator or cross linking agent may also be used to reduce shrinkage and reduce film stress. Such copolymers are described in U.S. Pat. No. 5,376,503 issued to Audett et al. on Dec. 27, 1994. The disclosure in Audett, found at columns 7–67, is incorporated herein by reference. While there is shown and described several exemplary embodiments of the invention, it is to be understood that the invention is not limited thereto but may be variously embodied to practice within the scope of the following claims.

What is claimed is:

1. A semiconductor die package, comprising a semiconductor die and a permanent protective material surrounding substantially all of the die, the protective material fully curable by exposure to ultraviolet light and shrinking 10% or less by volume upon curing and wherein the protective material is formed from a mixture including a polymer resin and a photoactive compound.

2. The semiconductor die package of claim 1, wherein the polymer resin comprises a phenol-formaldehyde epoxy novolac resin and the photoactive compound comprises triaryl sulfonium hexafluorophosphate.

3. The semiconductor die package of claim 2, wherein the protective material is formed from a mixture including about 44% by volume phenol-formaldehyde epoxy novolac resin and about 1% by volume triaryl sulfonium hexafluorophosphate.

4. A semiconductor die package, comprising a semiconductor die and a protective coating on at least one of the outer surfaces of the die, the protective coating formed from a mixture of a phenol-formaldehyde epoxy novolac resin and triaryl sulfonium hexafluorophosphate.

5. A semiconductor die package, comprising a semiconductor die and a protective coating on at least one of the outer surfaces of the die, the protective coating including a layer of silicon dioxide, a layer of silicon nitride and a layer of material formed from a mixture of a phenol-formaldehyde epoxy novolac resin and triaryl sulfonium hexafluorophosphate.

* * * * *